United States Patent
Tsuda

Patent Number: 5,970,334
Date of Patent: Oct. 19, 1999

[54] METHOD OF MANUFACTURING CONTACTS TO DIVERSE DOPED REGIONS USING INTERMEDIATE LAYER OF ARSENIC OR PHOSPHORUS

[75] Inventor: Hiroshi Tsuda, Tokyo, Japan

[73] Assignee: NEC Corporation, Toyko, Japan

[21] Appl. No.: 08/938,709

[22] Filed: Sep. 26, 1997

[30] Foreign Application Priority Data

Sep. 27, 1996 [JP] Japan .................................. 8-256432

[51] Int. Cl.⁶ .................................................. H01L 29/76
[52] U.S. Cl. ......................... 438/231; 438/648; 438/233; 438/658; 438/621; 438/677
[58] Field of Search .............. 438/209, 96, 253, 438/199, 231, 233, 648, 660; 257/393, 390, 412

[56] References Cited

U.S. PATENT DOCUMENTS

| | | | |
|---|---|---|---|
| 4,422,885 | 12/1983 | Brower et al. | 257/372 |
| 5,641,983 | 6/1997 | Kato et al. | 257/412 |
| 5,656,836 | 8/1997 | Ikeda et al. | 257/301 |

FOREIGN PATENT DOCUMENTS

| | | |
|---|---|---|
| 63-86514 | 4/1988 | Japan . |
| 2-3917 | 1/1990 | Japan . |
| 3-90572 | 4/1991 | Japan . |
| 7-193026 | 7/1995 | Japan . |
| 7-202011 | 8/1995 | Japan . |
| 8-78337 | 3/1996 | Japan . |

*Primary Examiner*—Olik Chaudhuri
*Assistant Examiner*—William David Coleman
*Attorney, Agent, or Firm*—Young & Thompson

[57] ABSTRACT

In a method of manufacturing a semiconductor device having a first conductive layer of a first conductive type and a second conductive layer of a second conductive type opposite to the first conductive type, an intermediate layer of a predetermined element selected from the group V is formed on the first and second conductive layers to a preselected thickness of several atomic layers. Next, a metal film is deposited on the intermediate film. The intermediate layer is absorbed in the metal film and vanishes during the deposition of the metal film. The metal film may be formed of tungsten or molybdenum, while the thickness of the intermediate layer may be equal to one or two atomic layers.

18 Claims, 3 Drawing Sheets

METHOD OF MANUFACTURING CONTACTS TO DIVERSE DOPED REGIONS USING INTERMEDIATE LAYER OF ARSENIC OR PHOSPHORUS

BACKGROUND OF THE INVENTION

This invention relates to a semiconductor device having metal films formed on semiconductor regions or layers of different conductive types and a method of manufacturing the same. Herein, it is to be noted throughout the instant specification that such semiconductor regions or layers will be collectively referred to as conductive layers.

Recently, it is required in a semiconductor device such as a MOS transistor to reduce a parasitic resistance of an electrode such as a source electrode, a drain electrode, and a gate electrode of the MOS transistor with a reduction of a semiconductor device in size.

To this end, a proposal has been made for a method of selectively forming a metal film of, for example, tungsten having a relatively low resistance over a silicon substrate in a self-alignment manner through a chemical vapor deposition (CVD). However, where the tungsten films are formed on conductive layers having different conductive types by the above selective growth method, it has been pointed out that the tungsten films on the conductive layers have different thicknesses from each other. This is because a growth rate of the tungsten is variable in dependency upon the conductive types of the conductive layers.

Specifically, when the tungsten films are formed on an n-type conductive layer and a p-type conductive layer, respectively, the thickness of the tungsten film on the n-type conductive layer is different from that of the tungsten film on the p-type conductive layer, since the growth rates of the tungsten are different from each other on both the n-type conductive layer and the p-type conductive layer. Such a difference between thicknesses of the tungsten films causes a leak current and the like. To solve the problem resulting from the difference between the thicknesses, a conventional method is disclosed in Japanese Unexamined Patent Publication No. Hei. 7-193026 (namely, 193026/1995).

In the above conventional method, the conductive layers of different conductive types are doped with impurities of the same conductive type. Consequently, the surface of the conductive layers is transferred to the same conductive type. As a result, the tungsten films are deposited to the same thickness on the conductive layers of the different conductive types because the growth rate of the tungsten is kept invariable on the same conductive type.

However, additional an impurity layer remains between the conductive layer and the tungsten film in this conventional method. The additional impurity layer forms a PN junction with the conductive layer. Therefore, a desired device structure can not be obtained because of the additional impurity layer. According to the conventional method, the tungsten reacts with the silicon (the conductive layer) by heating to form a tungsten silicide. The additional impurity region is absorbed in the tungsten silicide, and thereby the additional impurity region vanishes.

Thus, the additional process is needed to eliminate the additional impurity layer in the conventional method. Further, such a tungsten silicide increases the parasitic resistance of the electrode. The high resistance of the electrode is undesirable for the semiconductor device.

SUMMARY OF THE INVENTION

It is therefore an object of this invention to form metal films having the same thickness on the conductive layers of different conductive types with a simple process and without increasing a parasitic resistance.

According to this invention, an intermediate film of a predetermined element selected from the V-group is formed to a preselected thickness of a substantial atomic order on first and second conductive layers. The first conductive layer has a first conductive type, and the second conductive layer has a second conductive type which is opposite to the first conductive type.

Next, a metal film is deposited on the intermediate film to electrically contact the metal film with the first and second layers.

In this case, the preselected thickness of the intermediate film is selected so that the predetermined element vanishes during the deposition of the metal film.

Thus, according to this invention, the metal film is deposited on the intermediate film of the same conductive type. As a result, the thickness of the metal film formed on the first conductive layer is substantially identical with that of the metal film formed on the second conductive layer. In this case, the element acts as a nuclear forming center for the metal film during the deposition of the metal film.

Further, the thickness of the intermediate film is determined by an atomic order. Accordingly, the intermediate film vanishes during the deposition of the metal film. Specifically, the element is absorbed in the metal film during the deposition. Therefore, no additional layer is formed between the metal film and the conductive layer.

DESCRIPTION OF THE PREFERRED EMBODIMENT

Figure 1:
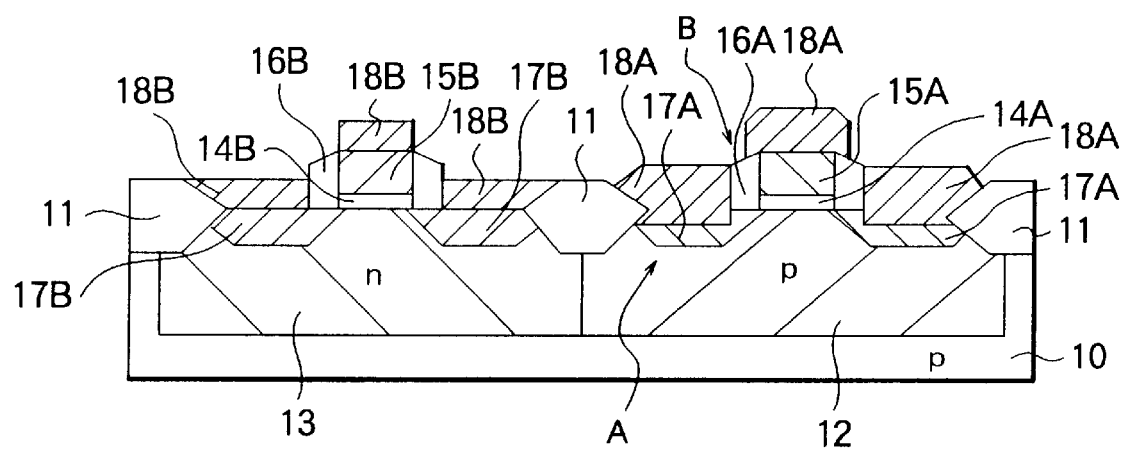
FIG. 1 shows a structure of a conventional semiconductor device.

Referring to FIG. 1, a conventional semiconductor device will first be described for a better understanding of this invention. The manufacturing method is equivalent to the conventional manufacturing method described in the preamble of the instant specification.

Silicon oxide films 11 are selectively left on a p-type silicon substrate 10 as field oxide films which serve as field isolation regions. A p-well 12 and an n-well 13 are formed as device forming regions in the p-type silicon substrate 10 and are adjacent to each other. A gate oxide film 14A and an n-type gate electrode 15A of an n-type polysilicon are successively formed within a center portion of the p-well 12. A gate oxide film 14B and a p-type gate electrode 15B of a p-type polysilicon are successively formed within a center portion of the n-well 13. The gate electrode 15A is covered with a side wall 16A of an oxide film, while the gate electrode 15B is covered with a side wall 16B of an oxide film. In addition, $n^+$-type diffusion layers 17A and $p^+$-type diffusion layers 17B are formed in the p-well 12 and the n-well 13 in a self-alignment manner, respectively. In this case, the $n^+$-type diffusion layers 17A and $p^+$-type diffusion layers 17B serve as source and drain regions, respectively.

Subsequently, a tungsten films 18A are selectively coated on the $n^+$-type diffusion layers 17A and the n-type gate electrode 15A, while a tungsten films 18B are also selectively formed the p+-type diffusion layers 17B and the p-type gate electrode 15B.

However, the tungsten films 18A on the n-type diffusion layers 17A and the n-type gate electrode 15A have a thickness different from that of the tungsten films 18B on the p-type diffusion layers 17B and the p-type gate electrode 15B. Specifically, the thickness of the tungsten films 18A on the n-type diffusion layer 17A and the n-type gate electrode 15A is thicker than that of the tungsten film 18B on the p-type diffusion layers 17B and the p-type gate electrode 15B.

The reason will be described as follows.

That is, a tungsten film is deposited in the form of a metal by reducing $WF_6$ in the selective tungsten growth method wherein $WF_6$ is used as a main material. In this event, occurrence of nuclei for the tungsten growth on the p-type diffusion layers 17B and the p-type gate electrode 15B is delayed as compared to occurrence of nuclei on the n-type conductive layers 17A and the n-type gate electrode 15A. This is because it is difficult for the p-type to supply electrons to the tungsten. Therefore, the growth rate of the tungsten is different from each other on the n-type and p-type regions. This results in the difference of the thickness of the tungsten film.

Let the growth duration become long enough to deposit the tungsten film 18B to a desired thickness which has a sufficient low resistance on the p-type diffusion layer 17B and the p-type gate electrode 15B. Under the circumstances, the thickness of the tungsten film 18A on the n-type diffusion layer 17A and the n-type gate electrode 15A becomes too thick. Consequently, the tungsten film 18A may approach the p-well 12 through the n-type diffusion layer 17A. Thereby, a leak current may occur at a p/n+ junction indicated by an arrow A. Also, nuclei may be formed on an insulating film such as an oxide film 11. This brings about an undesirable leak path. For example, where the nuclei are formed on the oxide film 11 between the p-MOS and the n-MOS, the tungsten film is deposited on the oxide film 11 from the nuclei. The deposited tungsten film forms the undesirable leak path between the tungsten film 18A and 18B. Further, the tungsten films 18A on the diffusing layers 17A may be contacted with the tungsten film 18A on the gate electrode 15A at the area indicated by an arrow B.

Another conventional method for solving the problem as to the thickness difference of the metal film is disclosed in Japanese Unexamined Patent Publication No. Hei. 7-193026.

Figure 2A:
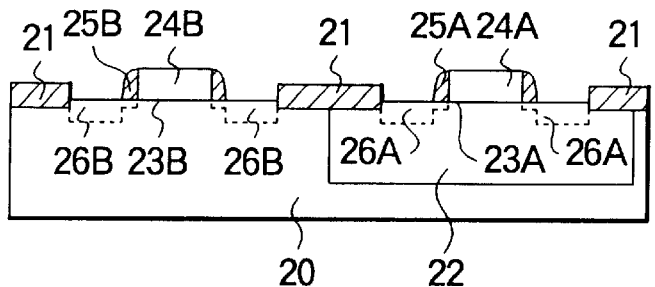
FIGS. 2A through 2C show a method of manufacturing a semiconductor device according to an another conventional method in the order of successive steps.
Figure 2B:
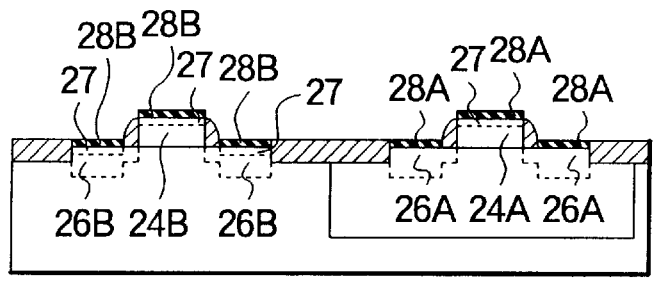
Figure 2C:
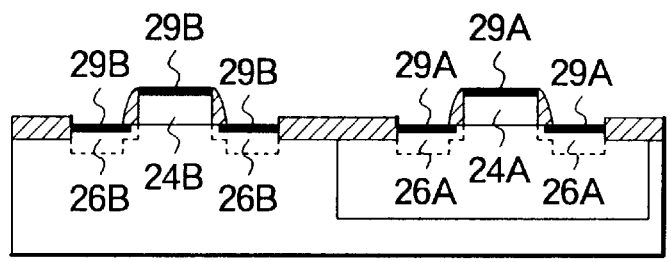

Referring to FIGS. 2A through 2C, the conventional method of forming a semiconductor device will be described below and is substantially equivalent to that described in the preamble of the instant specification.

As shown in FIG. 2A, silicon oxide films 21 are formed on a p-type silicon substrate 20 as field oxide films. Next, an n-well 22 is formed as a device forming regions. Further, a gate oxide film 23A is left on the n-well 22. A gate electrode 24A of polysilicon of an n-type is formed on the gate oxide film 23A and will be often called an n-type gate electrode. The gate electrode 24A has a side surface covered with an insulating film 25A which provides a side wall. Further, a gate oxide film 23B is formed on the p-type silicon substrate 20. A gate electrode 24B of polysilicon of an n-type is formed on the gate oxide film 23B and will be often referred to as an n-type gate electrode. The gate electrode 24B has a side surface covered an insulating film 25B which provides a side wall. Next, p-type diffusing layers 26A and n-type diffusing layers 26B are formed in the n-well 22 and p-type silicon substrate 20, respectively. In this case, the p-type diffusing layers 26A serve as source and drain regions of a PMOS transistor, while the n-type diffusing layers 26B serve as source and drain regions of an NMOS transistor.

Next, as shown in FIG. 2B, a p-type impurity is doped on the n-type diffusion layers 26B and the gate electrodes 24A and 24B to form a p-type region 27. Thereafter, tungsten films 28A are selectively deposited on the p-type diffusion layers 26A and the gate electrode 24A, while tungsten films 28B are selectively deposited on the n-type diffusing layers 26B and the n-type gate electrode 24B. In this case, the tungsten film 28A is as thick as the tungsten film 28B because the p-type region 27 is formed on the n-type diffusion layer 26B and the n-type gate electrodes 24A and 24B.

Subsequently, a thermal treatment is carried out for the tungsten films 28A and 28B to change the tungsten films 28A and 28B into tungsten silicides 29A and 29B as shown in FIG. 2C. In this state, the p-type region 27 is absorbed in the tungsten silicides 29A and 29B.

As mentioned above, the p-type region 27 is formed in the semiconductor device as shown in FIG. 2B in the conventional method. The p-type region is undesirable for the semiconductor device because the p-type region 27 forms a PN junction with the n-type diffusion layer 26B.

Therefore, the tungsten silicide film 29 must be formed to eliminate the p-type region 27 as shown in FIG. 2C in the conventional method. Thus, the thermal treatment is required to eliminate the p-type region 27 in the conventional method. Further, the formed tungsten silicide films 29 have a high resistivity as compared to the tungsten film itself. Therefore, the parasitic resistance inevitably becomes large in the illustrated structure.

Taking the above mentioned problem into consideration, this invention provides a method which is capable of reducing the parasitic resistance by using a simple process.

A principle of this invention will be described for a better understanding of this invention.

An element, such as As or P, selected from the group V is heated in a vacuum chamber and is vaporized into molecular atmosphere of $As_4$ or $P_4$. As a result, the chamber is put into the molecular atmosphere of $As_4$ or $P_4$ which is kept at a saturation vapor pressure dependent on the heating temperature. Under the circumstances, the elements of the V group can be deposited only on an exposed silicon surface by the heat treatment after vaporising to a thickness of an atomic order. This is because the elements of the V group are liable to be combined with the silicon. For example, this fact is described in Japanese Journal of Applied Physics, 1987.

On the other hand, the elements of the V group are easily separated from an oxide film such as $SiO_2$ and rendered to molecules of $As_4$ or $P_4$. Such a separation of the elements from the oxide film takes place on the basis of the fact that the combinations between the silicon and the oxygen in the $SiO_2$ is very strong. Therefore, the elements of the V group are selectively deposited as an intermediate film on a p-type conductive (diffusion) layer and a n-type conductive (diffusion) layer with the thickness of substantially atomic order.

Such an intermediate layer can be also deposited on the semiconductor surface by reacting hydride, chloride, fluoride, organic compound or a gas obtained by vaporizing a liquid by using a hydrogen gas or an inactive gas, such as nitrogen or argon as a carrier gas.

Thereafter, metal films (for example, tungsten films) are deposited on the n-type and the p-type conductive layers by the known selective CVD method, with the intermediate layer covered on the n-type and the p-type conductive layers. In this case, the thickness of the metal film on the n-type conductive layer is substantially equivalent to that of the metal film on the p-type conductive layer. This is because the metal films are formed on the elements of the V group of the same conductive type, and the growth rate of the metal film is kept constant on the intermediate layer of the same conductive type.

Specifically, at least one uncombined electron orbit is filled with two electrons in the element of the V group. This uncombined electron pair functions as an electron supplier and becomes a nucleus forming center of W appearing by reducing $WF_6$. That is, the nucleus forming center of the same degree exists both on the p-type conductive layer and the n-type conductive layer. As a result, the metal films are deposited on the both on the p-type conductive layer and the n-type conductive layer to the same thickness.

Further, since the element of the V group is deposited on the conductive layers at a single or a few atomic layers, no additional n-type conductive layer is left between the p-type conductive layer and the metal film.

Referring to FIGS. 3A through 3D, description will be made about a manufacturing method according to a first embodiment of this invention.

Figure 3A:
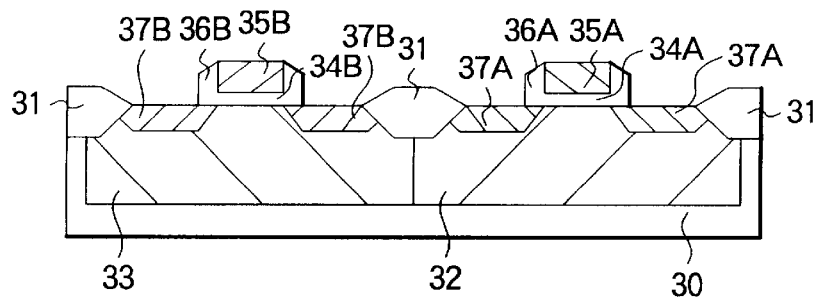
FIGS. 3A through 3D show a method of manufacturing a semiconductor device according to this invention.

As shown in FIG. 3A, silicon oxide films 31 are formed on a p-type silicon substrate 30 as field oxide films. Next, a p-well 32 and a n-well 33 are formed as the device regions in the silicon substrate 30 by doping impurities. Next, a gate oxide film 34A is formed on the p-well 32, while a gate oxide film 34B is formed on the n-well 33. Further, a gate electrode 35A of a polysilicon is formed on the gate oxide film 34A, while a gate electrode 35B of a polysilicon is formed on the gate oxide film 34B. The gate electrode 35A has a side face of an insulating film 36A which provides a side wall. The gate electrode 35B has a side face of an insulating film 36B which provides a side wall.

Subsequently, $n^+$-type diffusion layers 37A and $p^+$-type diffusion layers 37B are formed in the p-well 32 and the n-well 33 in a known self-alignment manner, respectively. At the same time, the gate electrode 35A becomes an n-type, while and the gate electrode 35B become a p-type by doping. In this case, the $n^+$-type diffusion layers 37A are operable as source and drain regions of an NMOS transistor, while $p^+$-type diffusion layers 37B are operable as source and drain region of a PMOS transistor.

Figure 3B:
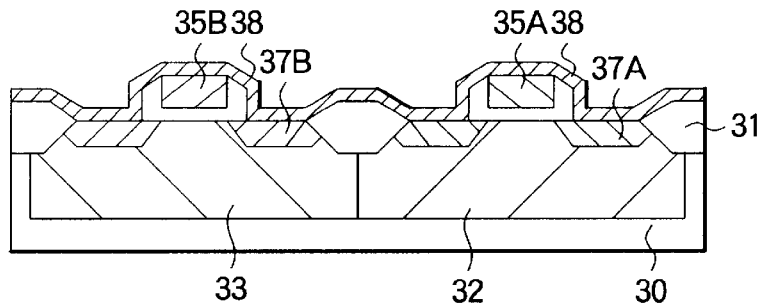

Subsequently, an As layer 38 of the element of the V group is deposited to a thickness of 1–2 atomic layers on the surface of the substrate 30 in a vacuum chamber (not shown), as shown in FIG. 3B. The silicon substrate 30 of about 300° C. or less (preferably lower) is exposed for 60 seconds or more in an atmosphere wherein a partial pressure of $As_4$ is set to $2.7 \times 10^{-4}$ pa. Thereby, the As layer is deposited to the above mentioned thickness.

In this case, although the substrate 30 may be exposed to a molecular beam generated by heating a solid state As, the elements of the V group can be deposited only by exposing in the atmosphere of an $As_4$ vapor because the vaporized $As_4$ has a high vapor pressure.

Figure 3C:
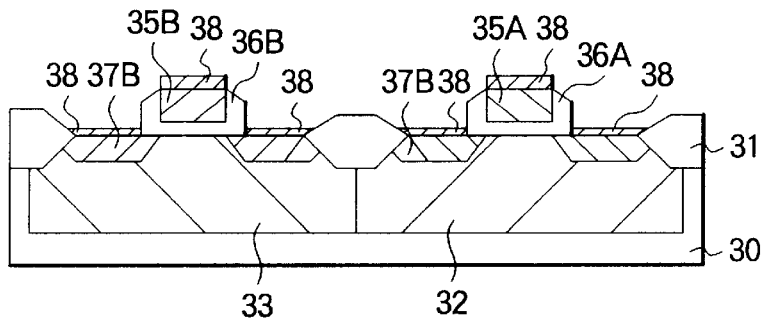

Next, the silicon substrate 30 is heated up to 600° C. in an atmosphere absent from any $As_4$ in a vacuum state in the absence of $As_4$. Consequently, the As element vanishes from the side walls 36A and 36B and the silicon oxide films 31 as shown in FIG. 3C. Thus, the As layer 38 remains only on the $n^+$-type and $p^+$-type diffusing layers 37A and 37B and the n-type and p-type gate electrodes 35A and 35B with the thickness of the atomic order kept therein.

In this case, the As layer 38 may include a rare portion of the As atoms having a covering rate of about 0.1.

Figure 3D:
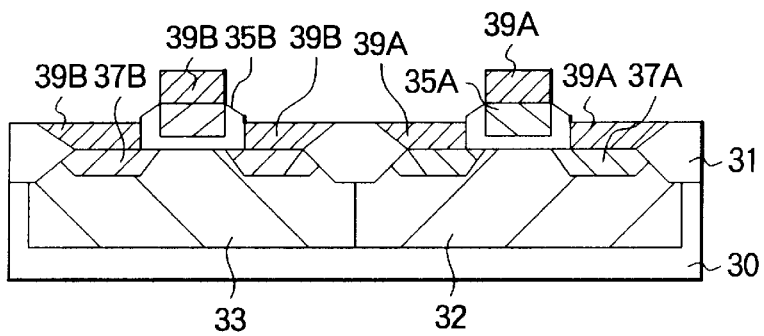

Subsequently, tungsten films 39A and 39B are deposited to a thickness of about 100 nm at a substrate temperature of 240–270° C. by using the known selective CVD method wherein $WF_6$ is reduced, as shown in FIG. 3D. Concretely, the tungsten films 39A are deposited on the $n^+$-type diffusion layers 37A and the n-type gate electrode 35A, while the tungsten films 39B are deposited on the $p^+$-type diffusion layers 37B and the p-type gate electrode 35B. In this case, the thickness of the tungsten film 39A is substantially equal to that of the tungsten film 39B. Further, the As layer 38 vanishes during the the deposition of the tungsten film 39A and 39B. This is because the As layer 38 is very thin and is therefore absorbed in the tungsten film 39A and 39B during the deposition.

By this method, it has been confirmed that gate wiring formed by the tungsten films 39A and 39B has a sheet resistance between 2 and 4 $\Omega/\square$ when each tungsten film 39A and 39B has a width between 0.2 and 1 $\mu$m and is fabricated in the above-mentioned conditions. Further, diffusion layer wiring formed by the tungsten films 39A and 39B has a sheet resistance between 2 and 4 $\Omega/\square$ when each tungsten film 39A and 39B has a width between 0.4 and 2 $\mu$m and is fabricated in the above-mentioned conditions.

On the other hand, selectivity is excellent because no leak current is detected between the source and the gate or between the drain and the gate. Further, a reverse direction leak current of $p/n^+$ junction for a pattern of 0.25 mm$^2$ or less is $10^{-9}$A or less on condition that a reverse voltage of 8V is applied. Thus, an excellent characteristics can be accomplished in the first embodiment.

The silicon substrate 30 is exposed to the $As_4$ atmosphere at the substrate temperature of 300° C. or less for 60 seconds in the above embodiment. However, there is no limitation as to the substrate temperature, the pressure of the atmosphere and the duration exposed in the atmosphere as long as the As layer 38 can be finally deposited to about a single or two atomic layers.

In addition, the As layer 38 may not be entirely deposited as shown in FIG. 3B when the As layer 38 is directly and selectively to thickness of about 1–2 atomic layers as shown in FIG. 3C.

Such a selective deposition is possible by a heat treatment higher than 600° C . However, there is no limitation as to the temperature if the As layer 38 can be selectively deposited to the above mentioned thickness. For example, the heat treatment may be performed at a temperature higher than 600° C. for a short time on the condition that the thickness of each diffusion layer is kept unchanged during the heat treatment. Also, the heat treatment may be performed at temperature lower than 600° C. for a long time on the condition that the As layer 38 can be removed from the surface of the oxide film (the side wall 36 and the oxide film 31).

Although in the above embodiment, the As is used as the element of the V group, the other elements of the V group, such as P, Sb may be used instead of As. Also, the tungsten is used as the metal film 39, but may be replaced by molybdenum. Instead, a silicide film may be used which is obtained by compounding the tungsten or the molybdenum with the silicon through a heat treatment.

Referring to FIG. 3, description will be made about a manufacturing method according to the second embodiment of this invention.

The method according to the second embodiment is similar to the first embodiment except that a component selected from hydrides, chlorides, fluorides and organic compounds is used to deposite a film which has a thickness of an atomic order. Such a selected component is vaporized from a liquid into a gas. Thereafter, the gas is reacted with the silicon surface to deposit the film of the atomic order thickness, as shown in FIG. 3B. This method is advantageous in that operability and controllability become excellent as compared to the method exposed in the As vapor like the first embodiment. For example, $AsH_3$ is irradiated at a real flow rate of 20 sccm onto the silicon substrate 30 for 3 minutes by mixing with $H_2$ gas. As a result, the As layer 38 can be selectively deposited as shown in FIG. 3C. The substrate 30 deposited above is transferred to a vacuum chamber kept in a vacuum which includes no $AsH_3$. Within the vacuum chamber, the metal film 39 (tungsten film) is deposited to a thickness of 100 nm at the substrate temperature of 240–270° C. by the known selective CVD method as shown in FIG. 3D.

In th is case, it has been confirmed that gate wiring formed by the tungsten films 39A and 39B has a sheet resistance between 2 and 4 $\Omega/\square$ when each tungsten film 39A and 39B has a width of between 0.2 and 1 $\mu$m and is fablicated in the above-mentioned conditions. Further, diffusing layer wiring formed by the tungsten films 39A and 39B has a sheet regiatance between 2 and 4 $\Omega/\square$ when each tungsten film 39A and 39B has a width of between 0.4 and 2 $\mu$m and is fabricated in the above-mentioned conditions.

On the other hand, selectivity is excellent because no leak current is detected between the source and the gate or between the drain and the gate. Further, a reverse direction leak current of $p/n^+$junction for a pattern of 0.25 mm$^2$ or less is $10^{-9}$A or less on the condition that a reverse voltage of 8V is applied. Thus, an excellent characteristics can be accomplished in the second embodiment.

Instead of the $AsH_3$ exemplified above, one selected from chlorides ($AsCl_3$, $AsCl_5$), fluorides ($AsF_3$, $AsF_5$), organic compounds [$As(CH_3)_3$, $As(N(CH_3)_2)_5$] may be used as a gas including the As, as long as the As layer 38 of a substantial atomic order are finally deposited over the substrate 30 as shown in FIG. 3C. In case of using a liquid, the liquid may be used after vaporising with a carrier gas.

Although the hydrogen gas is used as a mixing gas, the hydrogen gas may be used as a carrier gas. Further, inactive gases, such as $N_2$ or Ar, other than $H_2$ may be used as the mixing gas or the carrier gas.

In addition, the As is used as the element of the V group in the second embodiment. However, the any other elements of the V group, such as P, Sb, may be substituted for As. Also, although the tungsten above is exemplified as the metal in the second embodiment, molybdenum may be used in lieu of tungsten. Further, tungsten silicide or molybdenum silicide may be substituted for the tungsten or molybdenum.

What is claimed is:

1. A method of manufacturing a semiconductor device having a metal film over a substrate, comprising the steps of:

forming first and second conductive layers over said substrate, said first conductive layer having a first conductive type, and said second conductive layer having a second conductive type which is opposite to said first conductive type;

forming an intermediate film of a predetermined element selected from the V-group to a preselected thickness of several atomic layers on said first and second conductive layers; and depositing said metal film on said intermediate film to electrically contact said metal film with said first and second layers;

said preselected thickness of the intermediate film being selected so that the intermediate film is absorbed into the metal film and vanishes during the deposition of the metal film.

2. A method as claimed in claim 1, wherein:

the predetermined element comprises one selected from As, P, Sb.

3. A method as claimed in claim 1, wherein:

the preselected thickness is equal to one or two atomic layers.

4. A method as claimed in claim 1, wherein:

said metal film comprises one selected from tungsten and molybdenum.

5. A method as claimed in claim 1, wherein:

said metal film formed on said first conductive layer has a thickness substantially identical with that of said metal film formed on said second conductive layer.

6. A method as claimed in claim 1, wherein:

said element acts as a nucleus forming center for said metal film during the deposition of said metal film.

7. A method of manufacturing a CMOS device having a metal film over a substrate, comprising the steps of:

forming n-type and p-type wells in said substrate, respectively;

forming a pair of n-type conductive layers in said p-type well;

forming a pair of p-type conductive layers in said n-type well;

forming a n-type gate electrode between said n-type conductive layers;

forming a p-type gate electrode between said p-type conductive layers;

selectively forming an intermediate film of a predetermined element selected from the V-group to a preselected thickness of several atomic layers on said conductive layers and said gate electrodes; and depositing said metal film on said intermediate film to electrically contact said metal film with said conductive layers and said gate electrodes;

said preselected thickness of the intermediate film being selected so that the intermediate film is absorbed into the metal film and vanishes during the deposition of the metal film.

8. A method as claimed in claim 7, wherein:

the predetermined element comprises one selected from As, P, Sb.

9. A method as claimed in claim 7, wherein:

the preselected thickness is equal to one or two atomic layers.

10. A method as claimed in claim 7, wherein:

said metal film comprises one selected from tungsten and molybdenum.

11. A method as claimed in claim 7, wherein:

said metal film formed on said n-type conductive layers and said n-type gate electrode has a thickness substantially identical with that of said metal film formed on said p-type conductive layers and said p-type gate electrode.

12. A method as claimed in claim 7, wherein:

said element acts as a nucleus forming center for said metal film during the deposition of said metal film.

13. A method of manufacturing a CMOS device having a metal film over a substrate comprising steps:

forming n-type and p-type wells in said substrate, respectively;

forming a pair of n-type conductive layers in said p-type well;

forming a pair of p-type conductive layers in said n-type well;

forming a n-type gate electrode between said n-type conductive layers;

forming a p-type gate electrode between said p-type conductive layers;

forming a first gate oxide layer between said n-type conductive layers to cover said n-type gate electrode;

forming a second gate oxide layer between said p-type conductive layers to cover said p-type gate electrode;

entirely depositing an intermediate film of a predetermined element selected from the V-group to a preselected thickness of several atomic layers over said substrate;

entirely heating said intermediate film to selectively leave said intermediate film on said conductive layers and said gate electrodes; and depositing said metal film on said remained intermediate film to electrically contact said metal film with said conductive layers and said gate electrodes;

said preselected thickness of the intermediate film being selected so that the intermediate film is absorbed into the metal film and vanishes during the deposition of the metal film.

14. A method as claimed in claim 13, wherein:

the predetermined element comprises one selected from As, P, Sb.

15. A method as claimed in claim 13, wherein:

the preselected thickness is equal to one or two atomic layers.

16. A method as claimed in claim 13, wherein:

said metal film comprises one selected from tungsten and molybdenum.

17. A method as claimed in claim 13, wherein:

said metal film formed on said n-type conductive layers and said n-type gate electrode has a thickness substantially identical with that of said metal film formed on said p-type conductive layers and said p-type gate electrode.

18. A method as claimed in claim 13, wherein:

said element acts as a nucleus forming center for said metal film during the deposition of said metal film.

* * * * *